(12) United States Patent
Ausschnitt (10) Patent No.: US 6,803,995 B2
(45) Date of Patent: Oct. 12, 2004

(54) FOCUS CONTROL SYSTEM

(75) Inventor: Christopher P. Ausschnitt, Brookfield, CT (US)

(73) Assignee: International Business Machines Corporation, Armonk, NY (US)

( * ) Notice: Subject to any disclaimer, the term of this patent is extended or adjusted under 35 U.S.C. 154(b) by 477 days.

(21) Appl. No.: 09/765,148

(22) Filed: Jan. 17, 2001

(65) Prior Publication Data

US 2004/0070771 A1 Apr. 15, 2004

(51) Int. Cl.[7] .................. G03B 27/52; G03B 27/54; G03F 9/00; G03C 11/00
(52) U.S. Cl. .................. 355/55; 355/67; 430/5; 430/30
(58) Field of Search .................. 355/55, 53, 52, 355/62; 430/5, 30; 356/625, 624, 125

(56) References Cited

U.S. PATENT DOCUMENTS

| | | |
|---|---|---|
| 5,629,772 A | 5/1997 | Ausschnitt |
| 5,712,707 A | 1/1998 | Ausschnitt et al. |
| 5,731,877 A | 3/1998 | Ausschnitt |
| 5,756,242 A | 5/1998 | Koizumi et al. |
| 5,757,507 A | 5/1998 | Ausschnitt et al. |
| 5,776,645 A | 7/1998 | Barr et al. |
| 5,805,290 A | 9/1998 | Ausschnitt et al. |
| 5,807,647 A * | 9/1998 | Hashimoto ............. 430/5 |
| 5,914,784 A | 6/1999 | Ausschnitt et al. |
| 5,928,822 A | 7/1999 | Rhyu |
| 5,949,547 A | 9/1999 | Tseng et al. |
| 5,953,128 A | 9/1999 | Ausschnitt et al. |
| 5,965,309 A * | 10/1999 | Ausschnitt et al. ...... 430/30 |
| 5,968,693 A | 10/1999 | Adams |
| 5,976,740 A | 11/1999 | Ausschnitt et al. |
| 5,981,119 A | 11/1999 | Adams |
| 5,985,495 A | 11/1999 | Okumura et al. |
| 6,004,706 A | 12/1999 | Ausschnitt et al. |
| 6,027,842 A | 2/2000 | Ausschnitt et al. |
| 6,057,908 A * | 5/2000 | Ota .................. 355/55 |
| 6,128,089 A | 10/2000 | Ausschnitt et al. |
| 6,130,750 A | 10/2000 | Ausschnitt et al. |
| 6,137,578 A | 10/2000 | Ausschnitt |
| 6,542,221 B1 * | 4/2003 | Tang et al. ............. 355/55 |

OTHER PUBLICATIONS

Intellectual Property Network, *Method for Measuring Semiconductor Lithographic Tool Focus and Exposure*, IBM Technical Disclosure Bulletin, Jul. 1987, pp. 516–518.

Alexander Starikov, *Exposure Monitor Structure* SPIE Integrated Circuit Metrology, Inspection, and Process Control IV, Vol 1261, 1990, pp. 315–324.

* cited by examiner

*Primary Examiner*—Russell Adams
*Assistant Examiner*—D. Ben Esplin
(74) *Attorney, Agent, or Firm*—DeLio & Peterson LLC; Peter W. Peterson; Todd M. C. Li (57) ABSTRACT

A process for controlling focus parameters in a lithographic process used in manufacture of microelectronic circuits. The process comprises initially providing a lithographic mask having a target mask portion containing a measurable dimension sensitive to defocus, projecting an energy beam through the target mask portion onto a first location of a substrate at a first focus setting, and lithographically forming a first target on the substrate corresponding to the first focus setting, the first target containing a measurable dimension sensitive to defocus. The process then includes projecting an energy beam through the target mask portion onto a second location of the substrate at a second focus setting, lithographically forming a second target on the substrate corresponding to the second focus setting, the second target containing a measurable dimension sensitive to defocus, and measuring the defocus sensitive dimension for each of the first and second targets on the substrate. The defocus sensitive dimension of the first and second targets are then compared and there is determined a desired focus setting of the energy beam based on the comparison of the dimensions of the first and second target. The process may be used to form focus setting targets on a semiconductor wafer for use in manufacture of microelectronic circuits.

20 Claims, 5 Drawing Sheets

FOCUS CONTROL SYSTEM

BACKGROUND OF THE INVENTION

1. Field of the Invention

This invention relates to a manufacturing process requiring lithography and, in particular, to monitoring of lithographic process conditions used in manufacturing microelectronic components and providing improved focus control.

2. Description of Related Art

Control of a lithographic imaging process requires the optimization of exposure and focus conditions in lithographic processing of product substrates or wafers. Generally, because of the variations in focus, patterns developed by lithographic processes must be continually monitored or measured to determine if the dimensions of the patterns are within acceptable range. The importance of such monitoring increases considerably as the resolution limit, which is usually defined as minimum features size resolvable, of the lithographic process is approached. The patterns being developed in semiconductor technology are generally in the shape of lines both straight and with bends, having a length dimension equal to and multiple times the width dimension. The width dimension, which by definition is the smaller dimension, is of the order of 0.1 micron to greater than 1 micron in the current leading semiconductor technology. Because the width dimension is the minimum dimension of the patterns, it is the width dimension that challenges the resolution limits of the lithographic process. In this regard, because width is the minimum and most challenging dimension to develop, it is the width dimension that is conventionally monitored to assess performance of the lithographic process. The term "bias" is used to describe the change in a dimension of a feature from its nominal value. Usually the bias of interest is the change in the smallest of the dimensions of a given feature. Further, the term 'bias' is invariably used in conjunction with a process such as resist imaging, etching, developing etc. and described by terms such as image bias, etch bias, print bias, and the like.

Recent lithographic monitoring improvements have been in optical metrology which rely on human or machine-read visual measurement of targets which employ arrays of elements having line widths and spacing below the wavelength of the light used to make the measurements. Improvements in monitoring bias in lithographic and etch processes used in microelectronics manufacturing have been disclosed in U.S. Pat. Nos. 5,712,707; 5,731,877; 5,757,507; 5,805,290; 5,953,128; 5,965,309; 5,976,740; 6,004,706; 6,027,842; 6,128,089 and 6,130,750, the disclosures of which are hereby incorporated by reference. The targets and measurement methods of these applications rely on the increased sensitivity to focus variation provided by image shortening. Some of these types of targets use image shortening effects to make the visual measurements even though the individual array elements are not resolvable. Examples of such targets are disclosed in the aforementioned U.S. patents. Such targets permit visual monitoring of pattern features of arbitrary shape with dimensions on the order of less than 0.5 micron, and which is inexpensive to implement, fast in operation and simple to automate. These determine bias to enable in-line lithography/etch control using optical metrology, and wherein higher resolution metrology, such as SEM and/or AFM metrology, is required only for calibration purposes.

As described in particular in U.S. Pat. Nos. 5,953,128; 5,965,309; 5,976,740; 6,004,706; 6,027,842 and 6,128,089, the defocus of a lithographic image can be measured using dual-tone optical critical dimension (OCD) metrology. The problem remains, however, of providing a control system to feed back focus corrections to the lithography tool. The mere ability to determine that dose and/or focus is deviated from optimum is not sufficient in itself for closed-loop dose and focus control. For the most part, the prior art does not fully address 1) the need to determine both the sign and magnitude of a focus correction feedback to maintain an imaging system at optimum focus, 2) the need for adequate sensitivity to small defocus deviations from an optimum focus position, 3) the need to decouple and distinguish dose and focus variation, 4) the need for automated measurement and feedback. These requirements would be desirable for an automated focus control method and system.

Bearing in mind the problems and deficiencies of the prior art, it is therefore an object of the present invention to provide an improved lithographic system for manufacturing microelectronic circuits.

It is another object of the present invention to provide improved focus control in lithographic processing.

A further object of the invention is to provide a focus control system for a lithography tool.

It is yet another object of the present invention to provide a lithographic focus control system which provides feedback to the lithography tool.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a process for controlling focus parameters in a lithographic process used in manufacture of microelectronic circuits. The process comprises initially providing a lithographic mask having a target mask portion containing a measurable dimension sensitive to defocus, projecting an energy beam through the target mask portion onto a first location of a substrate at a first focus setting, and lithographically forming a first target on the substrate corresponding to the first focus setting, the first target containing a measurable dimension sensitive to defocus. The process then includes projecting an energy beam through the target mask portion onto a second location of the substrate at a second focus setting, lithographically forming a second target on the substrate corresponding to the second focus setting, the second target containing a measurable dimension sensitive to defocus, and measuring the defocus sensitive dimension for each of the first and second targets on the substrate. The defocus sensitive dimension of the first and second targets are then compared and there is determined a desired focus setting of the energy beam based on the comparison of the dimensions of the first and second target. The process may be used to form focus setting targets on a semiconductor wafer for use in manufacture of microelectronic circuits.

Preferably, the targets comprise a plurality of spaced elements having essentially the same length and width and forming an array, ends of the individual elements being aligned to form first and second opposing array edges, the array elements having a predefined pitch. The defocus sensitive dimension measured and compared for each of the first and second targets on the substrate is the width of the array.

The target mask portion and the targets formed on the substrate may be characterized as each comprising a first area having a set of parallel array elements and a second, contrasting area having a set of contrasting parallel array elements parallel to the array elements on the first contrasting area, such that the target defocus sensitive dimension is measured by determining the distance between ends of the array elements on each of the first and second contrasting areas. More preferably, the targets comprise first and second complementary, tone reversed target portions. The first target portion comprises a plurality of spaced element shapes having essentially the same length and width and forming an array. The second target portion comprises a plurality of spaced element spaces having essentially the same length and width and forming an array, with the first target portion element shapes being of contrasting tone to the second target portion element spaces. Ends of the individual elements in each target portion are aligned to form first and second opposing array edges, with the array elements having a predefined pitch. The defocus sensitive dimension measured and compared for each of the first and second targets on the substrate is the width of the array.

The energy beam may be projected through the target mask portion onto a plurality of substrate locations at a plurality of focus settings to create a plurality of targets, so that the widths of the individual targets are measured and compared to determine the desired focus of the energy beam. The plurality of energy beam focus settings are preferably distributed at predetermined positive and negative increments around an initial focus setting. The process may be used to form a plurality of focus setting targets on a semiconductor wafer for use in manufacture of microelectronic circuits, wherein at least one of the focus setting targets is lithographically formed simultaneously with forming functional lithographic circuit elements on the wafer. In its preferred embodiment, the focus setting targets are formed at locations on the wafer away from the functional lithographic circuit elements such that the functional lithographic circuit elements may be separated from the focus setting targets when the wafer is cut apart.

The determination of the desired focus setting of the energy beam may be used to correct energy beam focus during lithographic forming of the functional circuit elements. Preferably, the determination of the desired focus setting of the energy beam is based on both the sign and magnitude of a focus correction feedback, and the focus correction feedback is based on a negative offset target defocus and a positive offset target defocus.

In another aspect, the present invention provides a process for forming focus setting targets on a semiconductor wafer and controlling focus parameters in a lithographic process used in manufacture of functional microelectronic circuit elements. The process comprises providing a lithographic mask having a target mask comprising first and second target mask portions. The first target mask portion comprises a plurality of opaque, spaced element shapes having essentially the same length and width and forming an array. The second target mask portion comprises a plurality of transparent, spaced element spaces having essentially the same length and width and forming an array. Ends of the individual elements in each target portion are aligned to form first and second opposing array edges, with the array elements having a predefined pitch, and the width between the array edges being sensitive to defocus when printed on a substrate. The process then includes projecting an energy beam through the target mask portion onto a first location of a substrate at a first focus setting, and lithographically forming a first target on the substrate corresponding to the target mask at a first focus setting, the first target having complementary, tone reversed target array portions containing a measurable width between the target array edges sensitive to defocus. The process further includes projecting an energy beam through the target mask portion onto a second location of the substrate at a second focus setting, and lithographically forming a second target on the substrate corresponding to the target mask at a second focus setting, the second target having complementary, tone reversed target array portions containing a measurable width between the target array edges sensitive to defocus. The process also includes measuring the width between the target array edges for each of the first and second targets on the substrate and comparing the target array edge width of the first and second targets; determining a desired focus setting of the energy beam based on the comparison of the dimensions of the first and second target array widths; and using the determination of the desired focus setting of the energy beam to correct energy beam focus during lithographic forming of the functional circuit elements.

The energy beam may be projected through the target mask portion onto a plurality of substrate locations at a plurality of focus settings to create a plurality of targets, wherein the widths of the individual target arrays are measured and compared to determine the desired focus of the energy beam. Preferably, the plurality of energy beam focus settings are distributed at predetermined positive and negative increments around an initial focus setting. The process may be used to form a plurality of focus setting targets on a semiconductor wafer for use in manufacture of microelectronic circuits, wherein at least one of the focus setting targets is lithographically formed simultaneously with, and at locations on the wafer away from, functional lithographic circuit elements on the wafer, such that the functional lithographic circuit elements may be separated from the focus setting targets when the wafer is cut apart. The determination of the desired focus setting of the energy beam may be based on both the sign and magnitude of a focus correction feedback, and the focus correction feedback may be based on a negative offset target defocus and a positive offset target defocus.

A dose correction may be made simultaneously with the focus correction based on a measurement of the first and second targets on the substrate.

BRIEF DESCRIPTION OF THE DRAWING

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1 through 6 of the drawings in which like numerals refer to like features of the invention. Features of the invention are not necessarily shown to scale in the drawings.

The present invention provides a method and system of controlling focus of the energy beam used in the lithographic process. Such a focus control system is particularly useful because it knows both the sign and magnitude of defocus in order to provide feed back focus corrections to the lithography tool.

Initially, the method places one or more measurable targets within the area of the product reticle that is exposed simultaneously with chip patterns. The arrangement of targets can be tailored to spatial components of focus variation; such as across field tilt and curvature. The process then exposes a selected field or fields at focus offsets relative to the remainder of the fields on the product wafer, where the offsets are distributed in positive and negative increments about the product focus such that the total range of possible focus variation is encompassed. Measurement of the targets in the focus offset fields is then made along with measurement of representative fields exposed at the nominal product focus, and there is analysis of the data to determine the magnitude of product defocus relative to the intentionally offset defocus. The method then provides for feedback to the stepper to equalize the target defocus, in which case the product is at best focus.

Alternatively, the method places one or more measurable targets on the chip reticle in an unutilized area of the mask that can be bladed off, that is, printed separately from the chip. This area is limited only by the blading capability of the lithography tool and the size of the target, typically less than 50×50 μm. The arrangement of targets can be tailored to spatial components of focus variation. The process then exposes the targets at two or more focus settings microstepped on the product wafer, where the settings are distributed in positive and negative increments about the product focus such that the total range of possible focus variation is encompassed. Measurement of the microstepped targets is then made along with measurement of the product targets, and there is analysis of the data to determine the magnitude of product defocus relative to the microstepped target defocus. The method then provides for feedback to the stepper to equalize the microstepped target defocus, in which case the product is at best focus.

Figure 1:
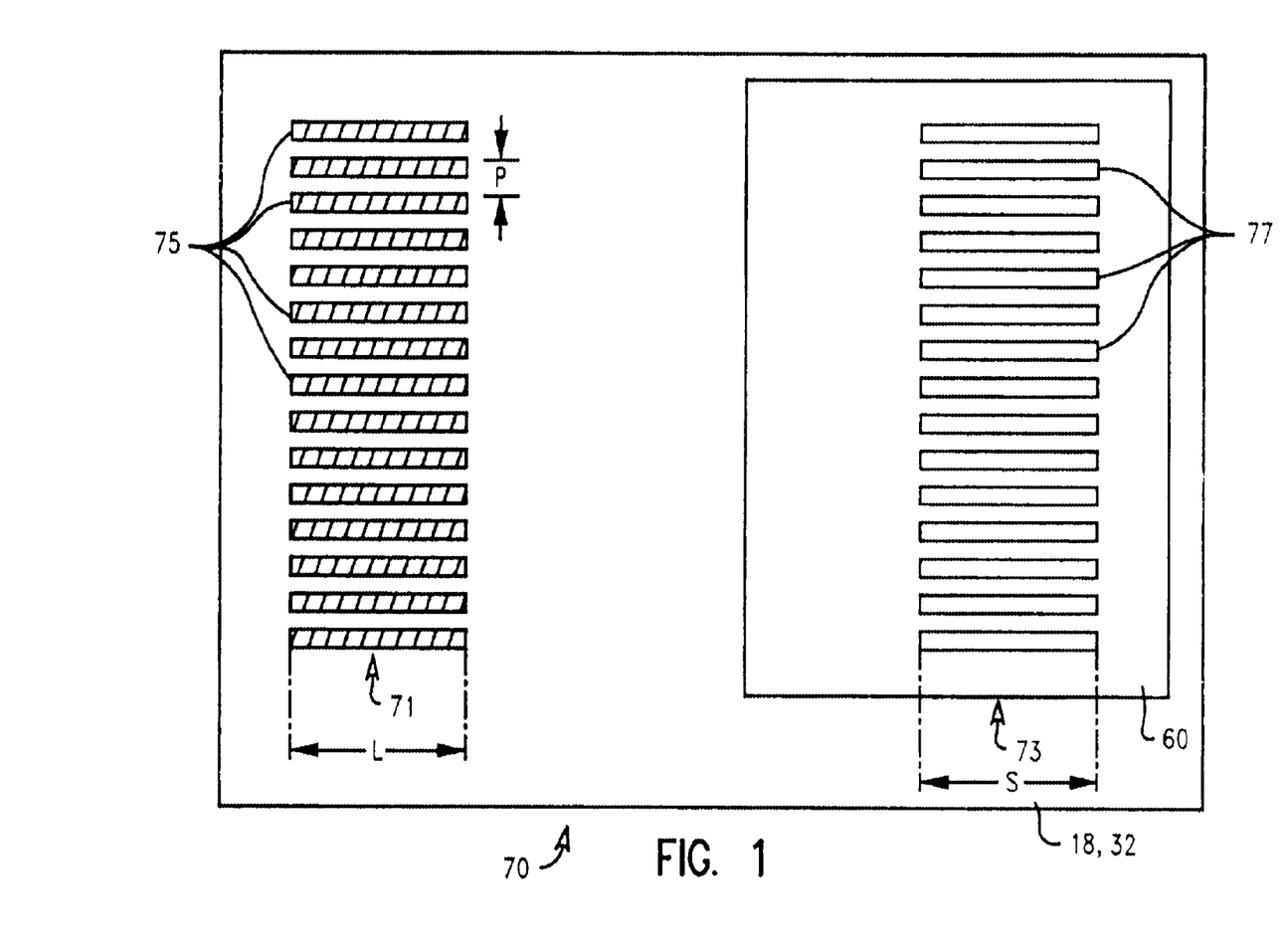
FIG. 1 is a top plan view of an embodiment of a target using contrasting tone reversing arrays.

A preferred target portion of a lithography mask using complementary dual-tone arrays for use in the present invention is shown in FIG. 1. Target 70 as disposed on a lithography mask (and later as printed on a semiconductor wafer substrate) comprises a pair of identical, but tone-contrasting arrays 71, 73. Array 71 comprises a plurality of equilength, equithickness parallel elements or lines (shapes) 75 which contrast with the substrate 18 (on a mask) or 32 (on the wafer). Array 73 comprises a plurality of equilength, equithickness parallel elements or spaces 77 on a contrasting background 60, which itself contrasts with substrate 18, 32. The target arrays 71, 73 comprise complementary dual tone patterns, which will be explained in more detail below. The free edges of the elements of array 71 and of array 73 are aligned along straight lines. The individual elements need not be spaced by a distance equal to the element thickness. The pitch P of the array elements is the thickness of each element plus the spacing between each element and is of a size such that the individual array elements are not necessarily resolved when viewed through the metrology tool. The pitches of the two arrays 71, 73 are equal and the thickness of the line (shape) elements of 71 is equal to the spacing of the space elements of 73. The width of arrays 71, 73 is given by the measurable dimensions L and S, respectively. The dimensions of the elements 75, 77 in arrays 71, 73, respectively, are identical, and the elements 75, 77 are parallel and spaced apart from each other in the horizontal dimension as shown.

Figure 2:
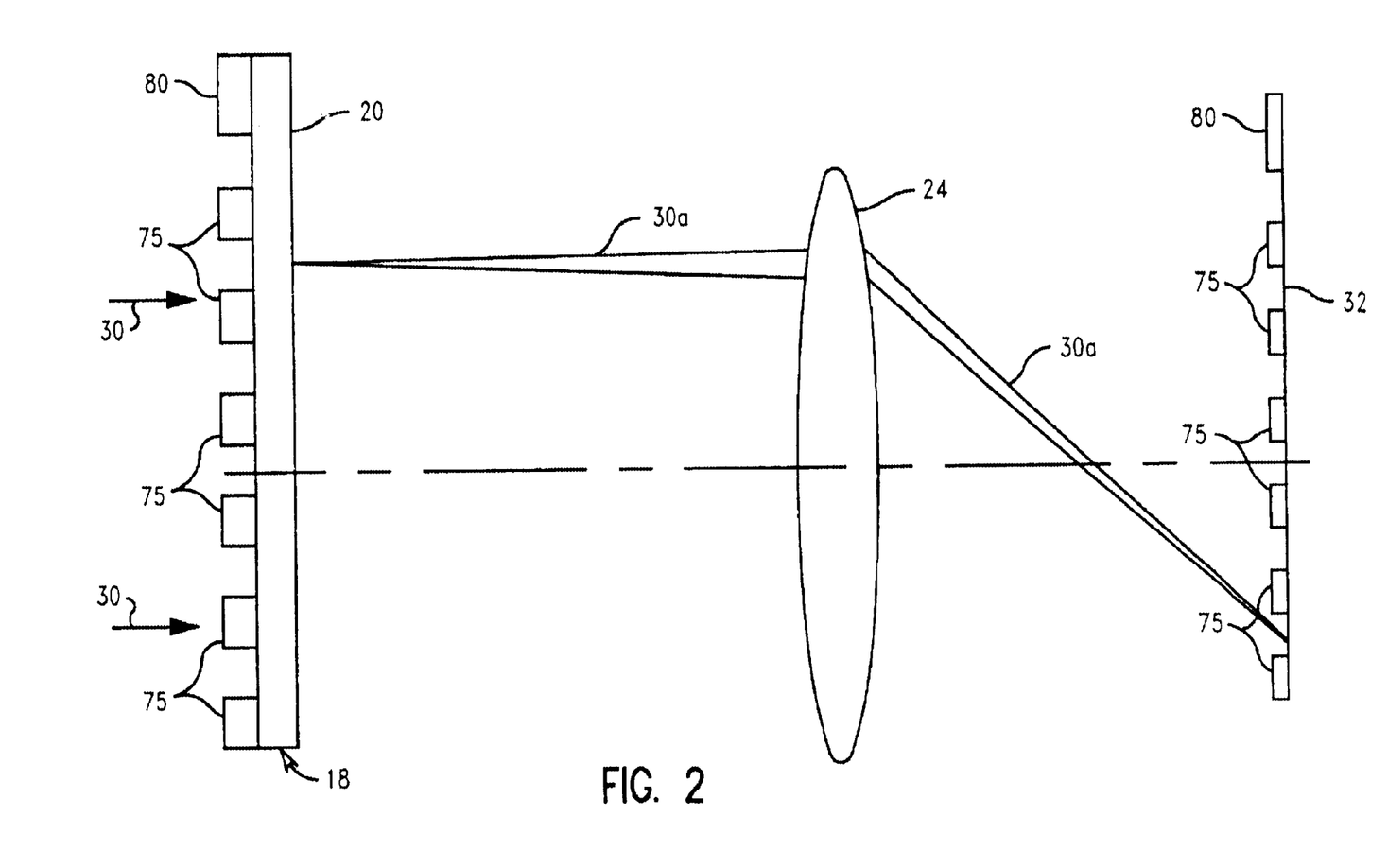
FIG. 2 is a schematic of a side view of a lithographic mask used to create a target image during lithography.
Figure 3:
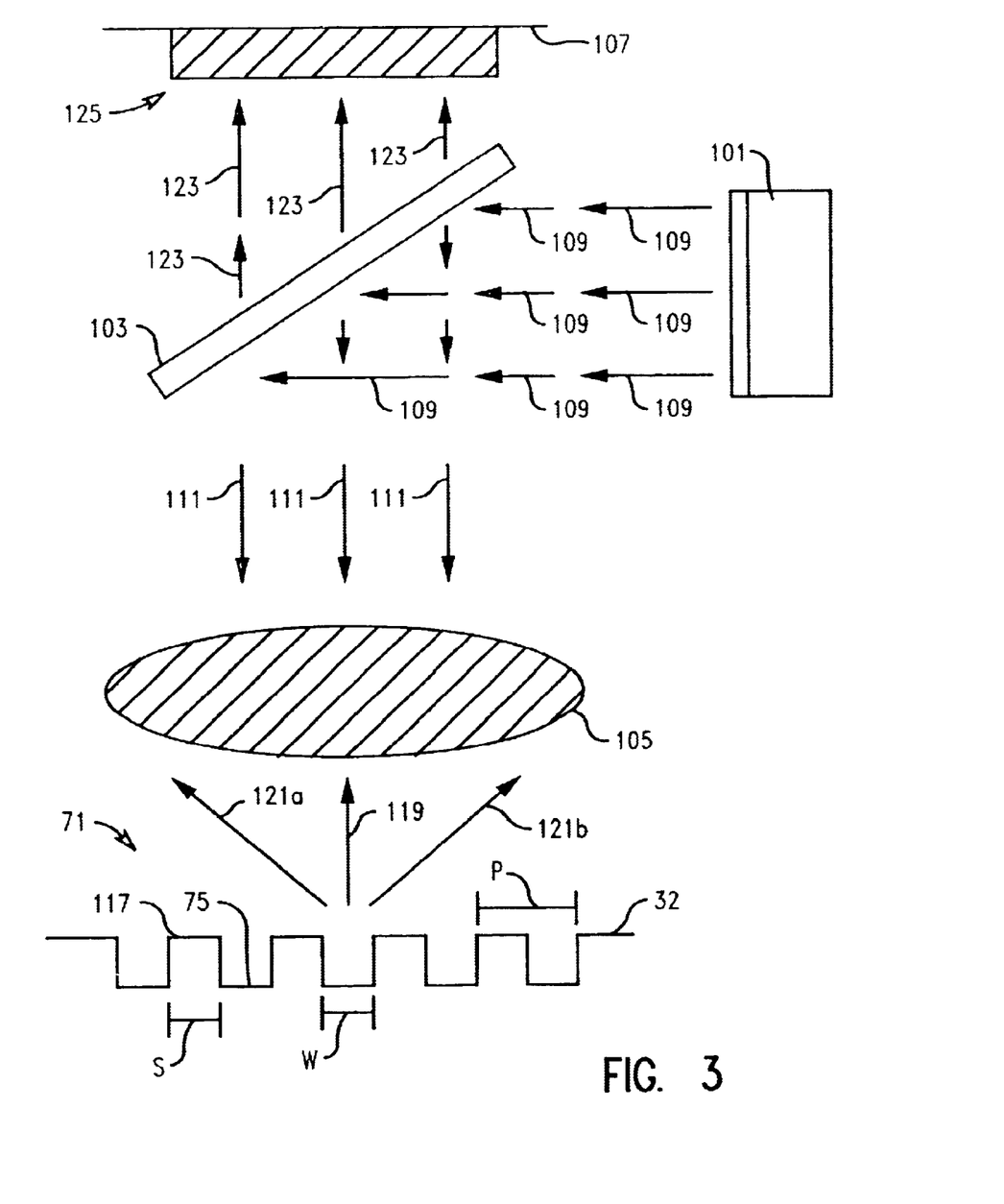
FIG. 3 is a schematic of an optical metrology tool measuring a target array.

An example of a lithography process using a mask made in accordance with the present invention is shown in FIG. 2. Radiation comprising energy beam 30 passes through a portion of mask 18 comprising a substrate layer 20 sufficiently transparent to the radiation on which are deposited opaque segments conforming to the target image to be projected. Opaque segments 75 conform to the parallel array elements of target 70 (FIG. 1) and form a portion of the total target portion of the lithography mask. The beam 30 portion that passes through the mask 18 between opaque segments 77 is illustrated by beam 30a. Beam 30a is focused by lens system 24 onto the surface 32 of a semiconductor wafer having conventional resist materials sensitive to the radiation. Radiation blocked by mask portions 75 does not transfer to the resist layer on surface 32. Thus, a contrasting latent image of the parallel array elements 75 (as well as the remainder of target 70) is formed on wafer resist surface 32 which conforms to the pattern of the opaque layer on the mask. The resist is then developed, and the pattern created by the latent image is used to produce a desired target or portion thereof on the wafer. The semiconductor wafer substrate 32 also includes functional microelectronic circuits 80 lithographically produced by corresponding patterns on mask 18. The circuits 80 may be lithographically exposed and etched simultaneously with target portion elements 75. The target of the present invention is employed to determine the quality of the lithographic formation of functional circuits 80. After the functional circuits are complete on the wafer, the functional lithographic circuit elements are separated from the focus setting targets by cutting apart the wafer.

The preferred target of the present invention utilizes a pattern control system based on the measurement of complementary tone patterns, i.e., patterns in which the tone is reversed. The "tone" of a lithographic pattern is determined by the presence or absence of resist material which is normally deposited in a layer or film on the surface of the substrate to be etched. Patterns are either resist shapes on a clear background (i.e., array lines 75) or the absence of resist shapes (i.e., array spaces 77) in a background of resist material. Complementary tone patterns can be formed by interchanging the areas that are exposed during the lithographic process.

These tone patterns may be created in resist material by preparing masks with opaque and transparent areas corresponding to the shapes or spaces to be created on the resist material, and then using a source of radiation on one side of the mask to illuminate and project the mask shapes and spaces on the resist layer on the opposite side of the mask, as described above in connection with FIG. 2. Resist layers have a resist threshold. When exposed to radiation or energized above the resist threshold, a latent image is formed. No latent image is created when the level of exposure to radiation is below the resist threshold. These mask shapes and spaces form corresponding latent images on the resist layer. The latent images are manifested by changes in film reflectivity and may be optically detected before developing by visual observation, for example, with a microscope.

Alternatively, complementary tone patterns may be exposed on resist material by other types of masks, for example, phase shift masks, or other methods, for example, an electron beam exposure tool. Instead of using masks, these other methods may form the shapes and spaces by multiple exposure of pixels or other discrete forms.

After the latent images on the resist material are developed, an etchant is used to attack the substrate not covered by the resist material. The etched areas or spaces of the substrate form trenches in the substrate, leaving the unetched areas or shapes as raised structures adjacent to the trenches. The etched images are formed by the walls between the raised areas and trenches, and will also form complementary etched images corresponding to the complementary tone patterns on the resist film.

The present invention is applicable to the control of all types of lithographic patterns, for example, lines, trenches, contacts and the like, where the array edge tracks the edge of individual elements with focus variation.

A consequence of using the aforementioned target design, in which the minimum pitch is perpendicular to the measurement direction, is that the length of minimum dimension patterns is monitored, rather than their width. Line lengths tend to be significantly more sensitive to process conditions than line widths as the resolution limits of any given lithography process are approached.

The target configurations can be tailored to mimic pattern layers in the manufacturing process (e.g., lines, contacts or islands), to increase the sensitivity of metrology (e.g., using tapered lines, daggers or sub-resolution patterns), and to characterize specific attributes of the lithographic process (e.g., linearity and proximity bias). The target enables optical measurement of critical dimension variation of both tones for patterning process control.

Unlike changes with exposure dose, it has been found that the length dimensions of the latent image and resist spaces and the dimensions of the unexposed area within a latent image and the resist shapes change in the same direction with different degrees of focus. That is, when the aerial image is defocused from optimum, the length dimensions of the unexposed area within a latent image and the resist shape, and the latent image and resist space, will both either increase or decrease in dimension, or remain the same.

Focus and dose parameters may be determined as a mathematical function of the measured dimensions of the latent or developed image shape, L, and space, S. To do so, the measured (L, S) response to exposure, E, and defocus, F, settings must be pre-characterized by measurements through a focus exposure matrix (FEM). The defocus is defined as the magnitude of the deviation of the focus from its optimum; namely $F=|z-z_o|$. The focus setting, z, is the deviation in microns from the tool focus baseline and $z_o$ is the optimum lithographic focus position. A parametric model describes the shape and space dimension response to focus and dose:

$$L,S = a_0^{L,S} + a_1^{L,S}E + (a_2^{L,S} + a_3^{L,S}E)F^2 \quad (1)$$

The coefficients $a_0 \ldots _3$ and the optimum focus $z_o$ are determined by a least-squares fit to the measured data. The exposure setting, E, is expressed as a fractional deviation of the exposure input to the stepper, $E_{FEM}$, from the optimum exposure, $E_o$, that prints chip features at their desired size at $z=z_o$; namely, $E=(E_{FEM}-E_o)/E_o$. Consequently, the optimum lithographic operating point is defined by E=0 and F=0.

Given the coefficients, $a_{0 \ldots 3}$, derived from the FEM, the simultaneous Equations (1) can be solved for (E, F), where F is the deviation from best focus, or "defocus", defined by: $F^2=(z-z_o)^2$.

$$E = \frac{-B \pm \sqrt{B^2 - 4AC}}{2A} \quad (2)$$

$$F^2 = \frac{L, S - (a_0^{L,S} + a_1^{L,S}E)}{a_2^{L,S} + a_3^{L,S}E}$$

Where:

$$A = a_1^S a_3^L - a_3^S a_1^L \quad (3)$$

$$B = a_3^S L - a_3^S S + a_0^S a_3^L + a_1^S a_2^L - a_2^S a_1^L - a_3^S a_0^L$$

$$C = a_2^S L - a_2^S S + a_0^S a_2^L - a_2^S a_0^L.$$

For the assumed model, only one of the solutions for E in Equation (2) is physically meaningful (falls within the dose range of the FEM). The quadratic dependence of focus implies two solutions for z symmetric about $z_o$. Thus, at a single location, we are only able to solve for the magnitude of the defocus, F, by Equation (3), where substituting either L or S, and the associated coefficients, gives the same answer.

In each case, actual measurements are made of the corresponding dimensions of the latent image shape and space, or the resist image shape and space, on the substrate. These measured dimensions and the pre-determined "a" coefficients are the inputs to Equation (2) to determine the corresponding dose and defocus (E, F). Ideally, in the case of controlling focus variation, the objective is to keep F as close to zero as possible. An acceptable tolerance about F=0 may be determined by experimentation to be acceptable for focus variations. If this determined value is outside the predetermined tolerance, then steps may be taken to modify or change the focus of the aerial image on the resist film. As Equation (2) shows, however, we can only determine the magnitude of the focus deviation, whereas corrective action requires that we know both the magnitude and sign of the focus deviation. Furthermore, the measurements (L, S) that determine F are performed at focus settings near $z_o$, where sensitivity to defocus is close to zero.

The present invention uses microstepped targets, preferably of the complementary type shown in FIG. 1, that have known focus offsets, preferably of equal and opposite magnitude, relative to a nominal target focus, to enable one to determine both the sign and magnitude of the focus correction to feedback to the lithography tool. The particular issue addressed by this invention is that it has been determined that nearly all focus sensitive patterns exhibit quadratic response to deviation from best focus. Consequently, the sign of the focus deviation cannot be determined from a single measurement of a single pattern, and the sensitivity of the patterns to small focus deviation is low. Furthermore, dose and focus variation can occur simultaneously in lithography. The measurement of two structures having different responses to dose and focus is required for lithography control.

The present invention uses complementary patterns of the type described in the aforementioned U.S. Pat. No. 5,976, 740 to decouple and distinguish dose and focus variation. It improves on the method of U.S. Pat. No. 5,976,740 by exposing these targets, at predetermined, known positive and negative focus offsets about a nominal or initially estimated best focus position. The measurement and analysis described in this application determines both the sign and magnitude of the feedback correction to minimize the run-to-run deviation from optimum focus and dose.

In its most basic form, the method includes projecting an energy beam through the target mask portion onto a first location of a substrate at a first focus setting, initially estimated to impart the best focus. As described previously, the target mask portion includes a plurality of spaced elements having essentially the same length and width and forming an array, with ends of the individual elements being aligned to form first and second opposing array edges, and the array elements having a predefined pitch comprising the sum of the element thickness and spacing. Preferably, the target includes a pair of the arrays, with one of the arrays being of a complementary, contrasting tone to the other of the arrays, as shown in FIG. 1. The process includes lithographically forming a first target on the substrate corresponding to the first focus setting. After lithographically exposing the target at the initial best focus position, the method then includes projecting an energy beam through the target mask portion onto a second location of the substrate at a second focus setting. The second target, corresponding to the second focus setting, is also lithographically formed on the substrate. Preferably, the method is continued to lithographically expose a number of same or different targets at different focus settings. The focus settings are preferably at a plurality of similar offsets or increments, both positive and negative, above and below the initial estimated best focus setting. The developing and etching of the different targets focus offsets may be performed simultaneously. The method then measures a measurable dimension sensitive to defocus, e.g., the distance between array edges in FIG. 1, for various target focus offsets on the substrate with an optical metrology tool such that the individual array elements are not necessarily resolved on the substrate in the direction of the pitch. The widths and distances measured by the array edges may be any of those shown and described in connection with FIG. 1 to determine array widths of the target focus offsets. The different measured widths of the various target focus offsets are compared, and fed back to the lithography tool by a focus controller to determine a desired focus setting of the energy beam, based on the comparison of the widths of the first and second target.

Figure 4:
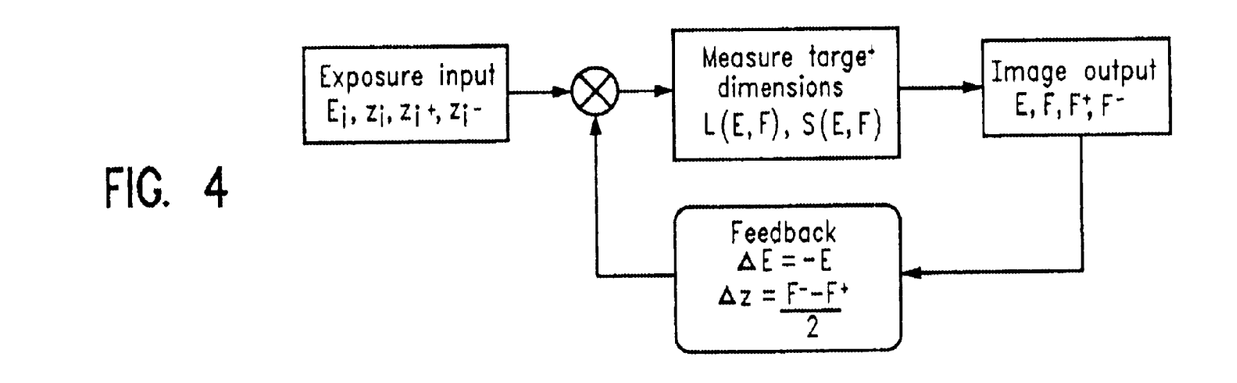
FIG. 4 is a schematic of the method of simultaneous dose and focus feedback control according to the invention.

In particular, FIG. 4 describes in a flowchart form the steps of practicing the method of the present invention. The schematic in FIG. 4 illustrates the method of the invention simultaneously to control dose and focus. Lithographic exposure is completed at dose and focus ($E_i$, $z_i$), the initial estimate of optimum dose and focus. Most chips and targets are printed using these nominal conditions. However, selected targets are printed using focus conditions $z_i^-$ and $z_i^+$, shifted by equal amounts positive and negative with respect to the nominal focus condition. The various dose and focus settings used for exposure correspond to the "input" exposure conditions. Measurements are conducted on targets printed using nominal and shifted focus conditions. The pre-determined response of the targets to dose and focus variation enables the determination of the "output" dose and defocus conditions; namely, the dose and focus conditions actually captured by the printed image. The difference between the output conditions and the optimum operating point defined by E=0 and F=0, is the magnitude of the feedback correction that must be applied to adjust the exposure input to optimum conditions. In the case of dose, the feedback correction required to bring the initial dose estimate to optimum, $E_i+\Delta E=0$, is the negative of the measured dose error, $\Delta E=-E$. In the case of focus, the feedback correction required to bring the initial focus estimate to optimum, $z_i-z_o+\Delta z=0$, is the negative offset target defocus minus the positive offset target defocus divided by two, $\Delta z=(F^--F^+)/2$.

Figure 5:
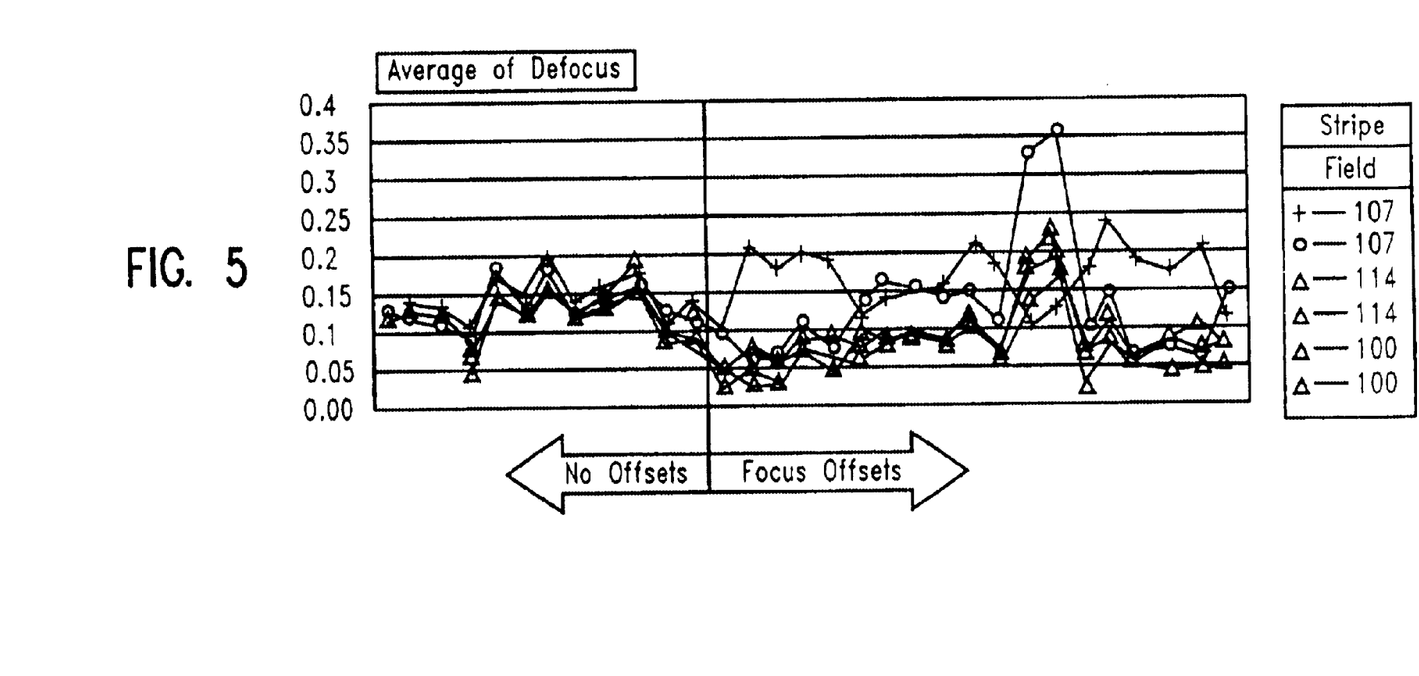
FIG. 5 is a plot representative defocus data derived from measurement of six different targets distributed across product wafers in a 150 nm ground rule process.
Figure 6:
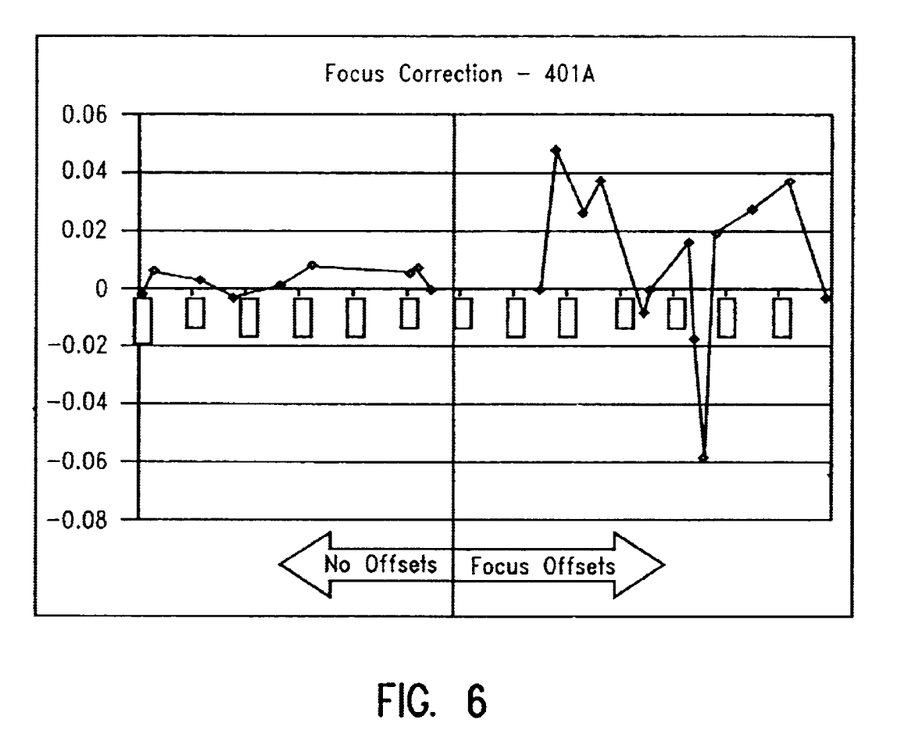
FIG. 6 is a plot of the focus correction Δz derived from the targets printed at positive and negative focus offsets.

The results and advantages of the method of the present invention are shown in FIGS. 5 and 6. FIG. 5 shows the measured defocus on six different targets distributed across product wafers in a 150 nm ground rule process. In the "no offset" regime, all of the targets were exposed at nominal focus. In the "focus offset" regime offsets to nominal focus were applied to two of the targets: a+150 nm focus offset relative to the "+" labeled target, and a−150 nm focus offset to the "o" labeled target. The independent tracking of the offset targets is illustrative of our invention's ability to monitor focus variation on product. The plot of the focus correction, Δz, in FIG. 6 further reveals that the sensitivity and precision of our method is sufficient to track and control focus to better than 10 nm.

Thus, the present invention provides for focus control during lithographic processing by determining both the sign and magnitude of a focus correction feedback to maintain an imaging system at optimum focus. It also provides adequate sensitivity to small defocus deviations from an optimum focus position. The result is feedback to a lithographic system for manufacturing microelectronic circuits which provides improved focus control for a lithography tool.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

I claim:

1. A process for controlling focus parameters in a lithographic process used in manufacture of microelectronic circuits comprising:

providing a semiconductor wafer substrate on which there are to be lithographically formed functional circuit elements;

providing a lithographic mask having a target mask portion containing a measurable dimension sensitive to defocus;

projecting an energy beam through the target mask portion onto a first location of the substrate at a first focus setting;

lithographically forming a first focus setting target on the substrate corresponding to the first focus setting, the first target containing a measurable dimension sensitive to defocus;

projecting an energy beam through the target mask portion onto a second location of the substrate at a second focus setting;

lithographically forming a second focus setting target on the substrate corresponding to the second focus setting, the second target containing a measurable dimension sensitive to defocus;

measuring the defocus sensitive dimension for each of the first and second targets on the substrate and comparing the defocus sensitive dimension of the first and second targets; and determining a desired focus setting of the energy beam based on the comparison of the dimensions of the first and second focus setting target; and using the determination of the desired focus setting of the energy beam to correct energy beam focus during lithographic forming of the functional circuit elements on the wafer substrate.

2. The process of claim 1 wherein the targets comprise a plurality of spaced elements having essentially the same length and width and forming an array, ends of the individual elements being aligned to form first and second opposing array edges, the array elements having a predefined pitch.

3. The process of claim 2 wherein the defocus sensitive dimension measured and compared for each of the first and second targets on the substrate is the width of the array.

4. The process of claim 1 wherein the targets comprise first and second complementary, tone reversed target portions, the first target portion comprising a plurality of spaced element shapes having essentially the same length and width and forming an array, the second target portion comprising a plurality of spaced element spaces having essentially the same length and width and forming an array, the first target portion element shapes being of contrasting tone to the second target portion element spaces, ends of the individual elements in each target portion being aligned to form first and second opposing array edges, the array elements having a predefined pitch.

5. The process of claim 4 wherein the defocus sensitive dimension measured and compared for each of the first and second targets on the substrate is the width of the array.

6. The process of claim 1 wherein the energy beam is projected through the target mask portion onto a plurality of substrate locations at a plurality of focus settings to create a plurality of targets, and wherein the widths of the individual targets are measured and compared to determine the desired focus of the energy beam.

7. The process of claim 6 wherein the plurality of energy beam focus settings are distributed at predetermined positive and negative increments around an initial focus setting.

8. The process of claim 1 and wherein at least one of the focus setting targets is lithographically formed simultaneously with forming the functional lithographic circuit elements on the wafer substrate.

9. The process of claim 8 wherein the focus setting targets are formed at locations on the wafer substrate away from the functional lithographic circuit elements such that the functional lithographic circuit elements may be separated from the focus setting targets when the wafer is cut apart.

10. The process of claim 1 wherein the target mask portion and the targets formed on the substrate each comprise a first area having a set of parallel array elements and a second, contrasting area having a set of contrasting parallel array elements parallel the array elements on the first contrasting area, and wherein target defocus sensitive dimension is measured by determining the distance between ends of the array elements on each of the first and second contrasting areas.

11. The process of claim 1 wherein the determination of the desired focus setting of the energy beam is based on both on sign and magnitude of a focus correction feedback.

12. The process of claim 11 wherein the focus correction feedback is based on a negative offset target defocus and a positive offset target defocus.

13. The process of claim 11 wherein a dose correction is made simultaneously with the focus correction based on a measurement of the first and second targets on the substrate.

14. A process for forming focus setting targets on a semiconductor wafer and controlling focus parameters in a lithographic process used in manufacture of functional microelectronic circuit elements comprising:
providing a semiconductor wafer substrate on which there are to be lithographically formed functional circuit elements;
providing a lithographic mask having a target mask comprising first and second target mask portions, the first target mask portion comprising a plurality of opaque, spaced element shapes having essentially the same length and width and forming an array, the second target mask portion comprising a plurality of transparent, spaced element spaces having essentially the same length and width and forming an array, ends of the individual elements in each target portion being aligned to form first and second opposing array edges, the array elements having a predefined pitch, the width between the array edges being sensitive to defocus when printed on a substrate;
projecting an energy beam through the target mask portion onto a first location of the substrate at a first focus setting;
lithographically forming a first target on the substrate corresponding to the target mask at a first focus setting, the first target having complementary, tone reversed target array portions containing a measurable width between the target array edges sensitive to defocus;
projecting an energy beam through the target mask portion onto a second location of the substrate at a second focus setting;
lithographically forming a second target on the substrate corresponding to the target mask at a second focus setting, the second target having complementary, tone reversed target array portions containing a measurable width between the target array edges sensitive to defocus;
measuring the width between the target array edges for each of the first and second targets on the substrate and comparing the target array edge width of the first and second targets;
determining a desired focus setting of the energy beam based on the comparison of the dimensions of the first and second target array widths; and
using the determination of the desired focus setting of the energy beam to correct energy beam focus during lithographic forming of the functional circuit elements.

15. The process of claim 14 wherein the energy beam is projected through the target mask portion onto a plurality of substrate locations at a plurality of focus settings to create a plurality of targets, and wherein the widths of the individual target arrays are measured and compared to determine the desired focus of the energy beam.

16. The process of claim 15 wherein the plurality of energy beam focus settings are distributed at predetermined positive and negative increments around an initial focus setting.

17. The process of claim 15 wherein the process is used to form a plurality of focus setting targets on a semiconductor wafer for use in manufacture of microelectronic circuits, and wherein at least one of the focus setting targets is lithographically formed simultaneously with, and at locations on the wafer away from, functional lithographic circuit elements on the wafer such that the functional lithographic circuit elements may be separated from the focus setting targets when the wafer is cut apart.

18. The process of claim 14 wherein the determination of the desired focus setting of the energy beam is based on both on sign and magnitude of a focus correction feedback.

19. The process of claim 18 wherein the focus correction feedback is based on a negative offset target defocus and a positive offset target defocus.

20. The process of claim 18 wherein a dose correction is made simultaneously with the focus correction based on a measurement of the first and second targets on the substrate.

* * * * *